United States Patent [19]
Pfleiderer

[11] 4,251,785
[45] Feb. 17, 1981

[54] INTEGRATED FILTER CIRCUIT

[75] Inventor: Hans-Joerg Pfleiderer, Zorneding, Fed. Rep. of Germany

[73] Assignee: Siemens Aktiengesellschaft, Berlin & Munich, Fed. Rep. of Germany

[21] Appl. No.: 51,119

[22] Filed: Jun. 22, 1979

[30] Foreign Application Priority Data

Aug. 31, 1978 [DE] Fed. Rep. of Germany ....... 2838006

[51] Int. Cl.³ .................... H03H 15/02; H03H 19/00
[52] U.S. Cl. .................................. 333/165; 333/166; 333/173
[58] Field of Search ...................... 333/165, 166, 173

[56] References Cited
PUBLICATIONS

Sequin & Tompsett; Charge Transfer Devices, Academic Press, Inc. 1975, pp. 52–59, 216–235.
Knauer et al.; Siemens Forschungs-und Entwicklungs-Berichte, vol. 7, No. 3, 1978, pp.138–142.
Caves et al; IEEE Journal of Solid State Circuits, vol. SC-12, No. 6, Dec. 1977, pp. 592–599.

Primary Examiner—Eli Lieberman
Attorney, Agent, or Firm—Hill, Van Santen, Steadman, Chiara & Simpson

[57] ABSTRACT

The invention relates to an integrated filter circuit including a charge transfer device (CTD) transversal filter to which a sample-and-hold stage is post-connected. In such filters, a smoothing of the step-shaped signal output voltage emitted from the said stage is strived for. According to the invention, the smoothing ensues by means of a RC low pass which is realized by means of a "switched capacitor" circuit. This has two capacitors and two alternatively actuatable, electronic switches. The area of employment of the invention particularly embraces CTD transversal filters which are employed in systems with varying clock pulse frequencies.

13 Claims, 7 Drawing Figures

INTEGRATED FILTER CIRCUIT

BACKGROUND OF THE INVENTION

1. Field of the Invention

This invention relates to an integrated filter circuit, and more particularly to one which includes a charge transfer device transversal filter.

2. Description of the Prior Art

Charge transfer devices are now widely recognized and understood. See, for example, the book by Sequin and Tompsett, "Charge Transfer Devices", Academic Press, New York, 1975. The invention of charge transfer devices offered an attractive possibility for analog signal processing. The charge transfer device and particularly the charge coupled device is essentially a clock controlled shift register for the transfer and storage of charge packets representing samples of an analog signal. Such a delay line with several input and output stages can be used to realize a variety of filter principles, one of which is implemented in the transversal filter. This type of filter has no closed loop. Thus, it has a finite impulse response and no stability problems are encountered. An interesting discussion of sampled analog filtering using switched capacitors as resistor equivalents is found in an article by J. Terry Caves et al in the "IEEE Journal of Solid State Circuits", Vol. SC-12, No. 6, December, 1977, pp. 592–599. Another article providing background is found in the publication Siemens Forschungs-und Entwicklungs-Berichte, Vol. 7, 1978, No. 3, pp. 138–142. The present applicant is one of the authors of this article.

BRIEF SUMMARY OF THE INVENTION

An object of the present invention is to augment a charge transfer device transversal filter by providing an outside filter which serves for smoothing the output signal supplied by the sample-and-hold stage.

The advantage attainable with the invention particularly lies wherein the filter effecting the smoothing of the output signal can be integrated in a simple manner and, particularly, can be arranged together with the remaining filter circuit on a chip, since it requires little semiconductor surface. Moreover, the further filter can be designed in such a manner that, despite its small space requirement, it exhibits the frequency characteristic of a low pass with a limiting frequency lying in the KHz range, whereby its smoothing properties are very pronounced.

BRIEF DESCRIPTION OF THE DRAWINGS

In the following, the invention is described in greater detail on the basis of the drawings. Thereby, they show.

DESCRIPTION OF THE PREFERRED EMBODIMENTS

Figure 1:
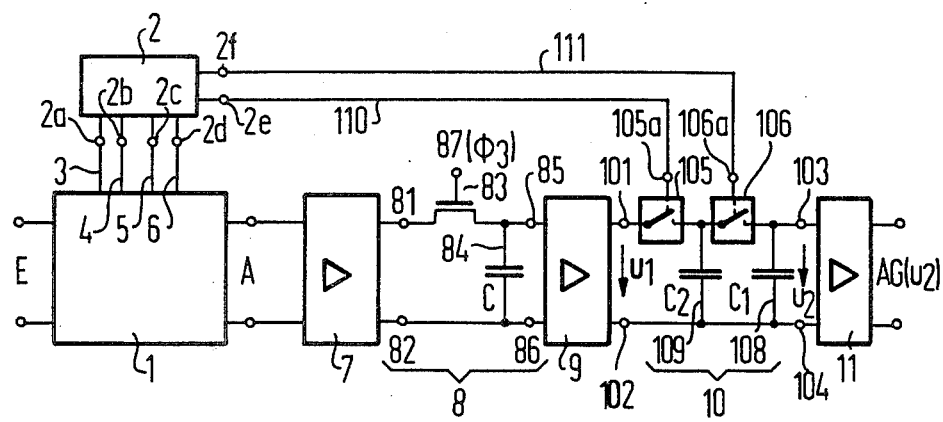
FIG. 1 is a basic representation of a preferred sample embodiment of the invention.

In FIG. 1, the block 1 represents a CTD transversal filter known per se, as is described, for example, on pages 216 through 232 in the book by Sequin and Tompsett, "Charge Transfer Devices", Academic Press, New York, 1975. Other embodiments of CTD transversal filters, which are likewise to be understood as being included here, may be derived from the article "CTD Transversal Filter With Parallel-In/Series-Out Configuration", by K. Knauer, H. J. Pfleiderer and H. Keller in Siemens-Forschungs-and Entwicklungs-Berichten, Vol. 7, 1978, No. 3, pages 1 through 5. The signal input of the transversal filter is designated as E, the filter output as A. A clock pulse voltage generator 2 exhibits outputs 2a through 2d at which clock pulse voltages $\phi_1$ through $\phi_4$ appear, which are of equal frequency, phase-displaced with respect to one another may be tapped, which clock pulse voltages $\phi_1$ through $\phi_4$ are supplied in a traditional manner via lines 3 through 6 to the transfer electrodes of a charge transfer device (CTD), not illustrated in detail, and which represents an essential component part of the transversal filter 1.

The output A of the CTD transversal filter 1 is connected via an amplifier 7 which exhibits a high-resistant input resistance with the input 81, 82 of a sample-and-hold stage 8, which has a field effect switching transistor 83 and a storage capacitor C lying in a shunt arm 84. The output 85, 86 of the sample-and-hold stage 8 is connected via an amplifier 9 which, likewise, has a high-resistance input resistance with the input 101, 102 of a further filter whose output 103, 104 is connected via an amplifier 11 with high input resistance to the circuit output AG.

Figure 2:
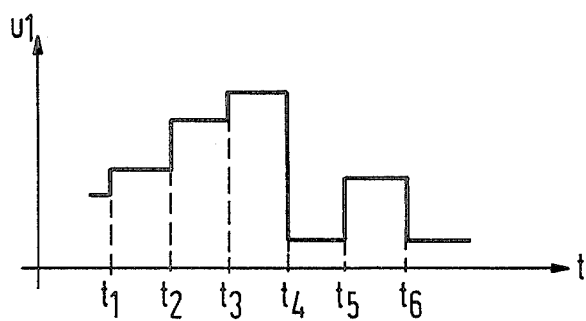
FIG. 2 is a voltage/time diagram for the explanation of the circuit of FIG. 1.
Figure 3:
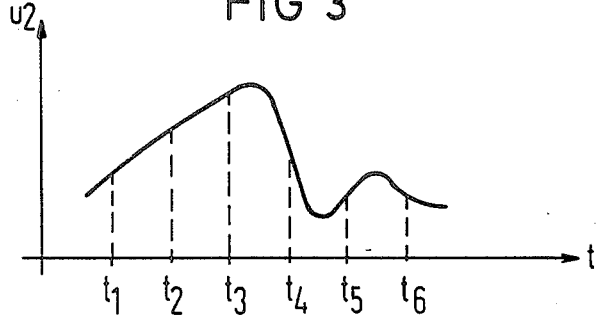
FIG. 3 is a further voltage/time diagram for the explanation of the circuit of FIG. 1.

The clock pulse voltage $\phi_3$ of the CTD transversal filter 1 is supplied to the gate connection 87 of the field effect switching transistor 83. Upon occurrence of each clock pulse of $\phi_3$, the source-drain segment of 83 becomes conductive so that the capacitor C loads or, respectively, transfers the momentary value of the transversal filter output signal present at this time and which is tapped at the circuit points 81, 82. FIG. 2 shows the temporal course of the voltage $u_1$ occurring at C and amplified in 9, whereby the points in time of the occurrence of the clock pulses of $\phi_3$ are respectively referenced $t_1$ through $t_6$. In the schematic representation of FIG. 2, one can see the step-shaped course of $u_1$. By means of the smoothing effect of the further filter 10 designed as a low pass filter, a voltage course $u_2$ according to FIG. 3 then is produced at the circuit output AG.

In FIG. 1, the filter 10 has a first capacitor $C_1$, a second, significantly smaller capacitor $C_2$ and two alternately actuatable electronic switches 105 and 106. Thereby, the circuit elements are gathered together to form a four-pole circuit with the input 101, 102 and the output 103, 104.

The switches 105 and 106 are provided in series with respect to one another in the series arm 107 of this four-pole circuit, whereas the first capacitor $C_1$ is inserted in an output-side shunt arm 108 and the second capacitor $C_2$ is inserted in a shunt arm 109 connected between the switches 105 and 106.

The clock pulse voltage generator 2 has further outputs 2e and 2f, in which two clock pulse voltages which are of the same frequency and phase-displaced with respect to one another, can be tapped, which are supplied to the control inputs 105a and 106a of the switches 105 and 106 via lines 110 and 111.

The four-pole circuit lying between the circuit points 101, 102 and 103, 104 is known per se from the "IEEE Journal of Solid State Circuits", Vol. SC-12, No. 6, December, 1977, pages 592 through 599, particularly FIGS. 1 and 2. As also proceeds from the description of the said Figures, in an alternating actuation of the switches 105 and 106, whereby first 105 is closed and 106 remains open whereas, subsequently, 106 closes and 105 opens, there first occurs a charge of $C_2$ to the amplitude of a signal tapped at 101, 102, whereas, subsequently the capacitors $C_1$ and $C_2$ are switched via the series arm 107 and the shunt arms 108 and 109 into a circuit in which they lie in series to one another, so that a partial transmission of the charge of $C_2$ can ensue to $C_1$.

Given the assumption that the capacitance of $C_1$ is significantly greater than that of $C_2$—let a ratio of 100:1 be considered as an example of this—and a periodic actuation of the switches 105 and 106 ensues for a period T, the four-pole circuit 10 simulates a RC low pass filter with an ohmic resistance R in the series arm 107 and the capacitor $C_1$ in the shunt arm 108, whereby the value R corresponds to the quotient $T/C_2$. Thereby, $C_2$ is to be understood as the capacitance of the capacitor $C_2$. If one selects the period T as 10 μs, which corresponds to a clock pulse frequency of the clock pulse voltages supplied to the switches 105 and 106 of 100 KHz, and dimensions the capacitors $C_1$ and $C_2$ in such a manner that their capacitances are in the ratio 100:1, then, given a capacitance of 10 pF for $C_1$, there ensues an equivalent ohmic resistance of 1 MΩ in the series arm 107 of the four-pole circuit and a limiting frequency of approximately 10 kHz for the low pass filter. Given a CTD transversal filter 1 which is operated with a clock pulse frequency of 16 kHz, by so doing, you already obtain a clear smoothing of the voltage course $u_1$.

The amplifier 11 can also be omitted in FIG. 1 when the output AG of the integrated filter circuit according to the invention is terminated with a high-resistance, i.e., with a resistor that is significantly greater than 1 MΩ.

Figure 4:
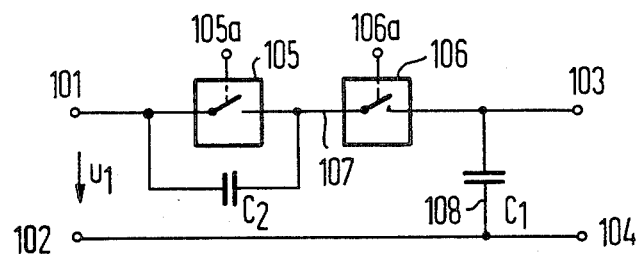
FIG. 4 is an alternative embodiment of a partial circuit of FIG. 1.

FIG. 4 shows another embodiment of the four-pole circuit 10 which is to be employed in place of that described above in FIG. 1. The circuit parts and connection points already described on the basis of FIG. 1 are provided with the same reference symbols in FIG. 4. In contrast to FIG. 1, the capacitor $C_2$ is now connected parallel to the switch 105. Thereby, in the first switching phase in which the switch 105 is closed whereas the switch 106 is opened, there ensues a discharge of $C_2$ via the switch 105, whereas in the second switching phase (105 opened, 106 closed), a charge circuit is produced for the series connection formed of $C_1$ and $C_2$, whose connections 101, 102 lie at a voltage which is given by means of the amplitude value of an adjacent input signal $u_1$. Given the precondition that $C_1$ exhibits a significantly greater capacitance than $C_2$, the relationship already explained in the basis of FIG. 1 is valid, according to which the series arm 107 simulates an ohmic resistance whose value corresponds to the quotient $T/C$, whereby T signifies the period of the clock pulse voltages actuating the switches 105 and 106, and $C_2$ signifies the capacitance of the capacitor $C_2$.

Figure 5:
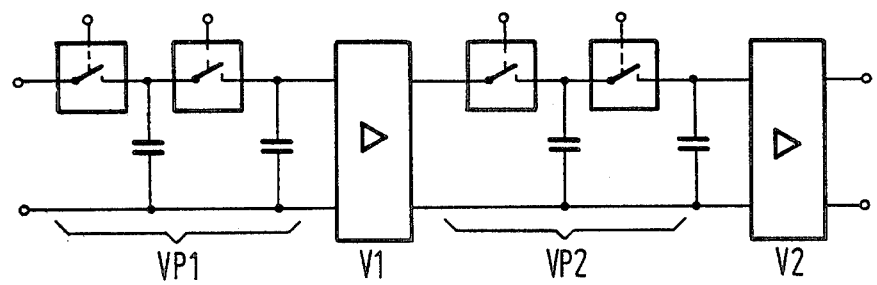
FIG. 5 is a further development of a partial circuit of FIG. 1.

The smoothing properties of the further filter can be further significantly improved when, instead of a single four-pole circuit 10, a cascade circuit consisting of a plurality of such circuits is provided, of which each is augmented by means of an output-side amplifier with high input resistance. FIG. 5 illustrates a two-stage cascade circuit of this type, whereby the individual four-pole circuits are referenced with VP1 and VP2, the terminating amplifiers with V1 and V2. Of course, the four-poles VP1 and VP2 can also be designed according to FIG. 4.

Figure 6:
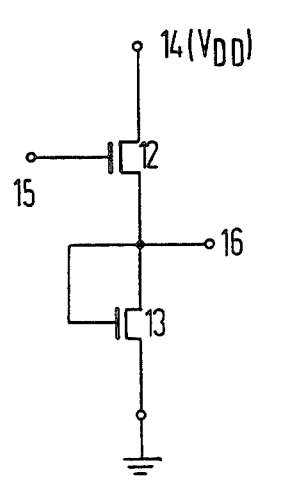
FIG. 6 is a preferred embodiment of an amplifier contained in FIGS. 1 and 5.

FIG. 6 shows a preferred embodiment of the amplifiers 7, 9, 11, V1 and V2, which is constructed as a source-follower-stage equipped with MIS field effect transistors. Two field effect transistors 12 and 13 are connected in series with their source-drain segments, whereby the drain connection of 12 is connected with a connection 14 carrying the supply voltage $V_{DD}$, whereas a source connection of 13 is connected with ground potential. The gate connection 15 of the transistor 12 forms the amplifier input, whereas the amplifier output 16 is applied to the source connection of the transistor 12. The gate connection of the transistor 13 representing a load element is connected with its drain connection, insofar as the transistor 13 is of the enhancement type. If 13 is a matter of a transistor of the depletion type, then its gate is to be connected with its source connection.

Figure 7:
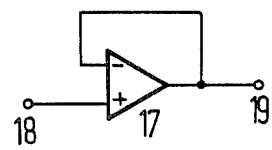
FIG. 7 is a different embodiment of the amplifier contained in FIGS. 1 and 5.

FIG. 7 shows another embodiment of the amplifiers 7, 9, 11, V1 and V2. Hereby, an operational amplifier 17 is provided, whose output 19 is connected with its negative input, whereas the signal to be amplified is supplied to its positive input 18. The circuit according to FIG. 7 represents a realization of a power amplifier with high-resistant input resistance.

The electronic switches 105 and 106 can be advantageously realized as field effect switching transistors whose insulated gate electrodes are conducted to the control inputs 105a and 106a. A particularly favorable and interference-free operating behavior is produced for the filter circuit according to the invention when the frequency of the clock pulse voltages supplied to the control inputs 105a and 106a represents a whole multiple of the frequency of the transfer clock pulse voltages $\phi_1$ through $\phi_4$ supplied to the CTD transversal filter.

It will be apparent to those skilled in the art that many modifications and variations may be effected without departing from the spirit and scope of the novel concepts of the present invention.

I claim as my invention:

1. Integrated filter circuit which includes a charge transfer device transversal filter and an output-side sample-and-hold stage, comprising on the output side of said sample-and-hold stage, a further low pass filter which includes a first capacitor, a second smaller capacitor whose capacitance is significantly smaller than the capacitance of said first capacitor, first and second alternately actuable electronic switches, a transfer circuit leading via said first switch for said second capacitor and a transfer circuit proceeding via said second switch for a series connection formed of said two capacitors.

2. An integrated filter circuit according to claim 1, in which said further low pass filter consists of a four-pole in whose series arm the said two switches are arranged in series to one another, said first capacitor being inserted in an outside shunt arm and said second capacitor being inserted in a shunt arm connected between said two switches.

3. An integrated filter circuit according to claim 1, in which said further low pass filter consists of a four-pole in whose series arm said second switch is arranged in series in a parallel connection consisting of said first switch and said second capacitor, said first capacitor being inserted in an outside shunt arm.

4. An integrated filter circuit according to claim 3, in which said further filter includes an amplifier with a high resistant input resistance whose input is connected in parallel to said first capacitor and whose output forms the output of said integrated filter circuit.

5. An integrated filter circuit according to claim 4, in which said further filter comprises a cascade circuit of a plurality of four-poles of amplifiers with high resistant input resistance, respectively arranged on the output side.

6. An integrated filter circuit according to claim 5, in which a pair of amplifiers with high resistant input resistance is provided between said transfer filter and said sample-and-hold stage as well as between said sample-and-hold stage and said further filter.

7. An integrated filter circuit according to claim 6, in which said amplifiers consist of a source-follower-stage formed as part of the integrated circuit.

8. An integrated filter circuit according to claim 6, in which each of said amplifiers consists of a power amplifier with a high resistant input resistance which is equipped with an operational amplifier having a feedback.

9. An integrated filter circuit according to claim 1, which includes a clock pulse generator having two clock pulse outputs for two first clock pulse voltages phase displaced with respect to one another, said outputs being connected with the control inputs of said electronic switches and which further includes four additional clock pulse lines having second clock pulse voltages exhibiting a lower frequency which serve for the operation of the charge transfer device transversal filter.

10. An integrated filter circuit according to claim 9, in which the frequency of the first clock pulse voltages is a whole multiple of the frequency of the second clock pulse voltages.

11. An integrated filter circuit according to claim 2, in which said further filter includes an amplifier with a high resistant input resistance whose input is connected in parallel to said first capacitor and whose output forms the output of said integrated filter circuit.

12. An integrated filter circuit according to claim 11, in which said further filter comprises a cascade circuit of a plurality of four-poles of amplifiers with high resistant input resistance, respectively arranged on the output side.

13. An integrated filter circuit according to claim 12, in which a pair of amplifiers with high resistant input resistance is provided between said transfer filter and said sample-and-hold stage as well as between said sample-and-hold stage and said further filter.

* * * * *